(12) United States Patent
Chan et al.

(10) Patent No.: US 6,191,609 B1
(45) Date of Patent: Feb. 20, 2001

(54) COMBINATION OF GLOBAL CLOCK AND LOCALIZED CLOCKS

(75) Inventors: Albert Chan, Palo Alto; Ju Shen, Saratoga; Cyrus Y. Tsui, Los Altos; Allan T. Davidson, San Jose, all of CA (US)

(73) Assignee: Lattice Semiconductor Corporation, Hillsboro, OR (US)

( * ) Notice: Under 35 U.S.C. 154(b), the term of this patent shall be extended for 0 days.

(21) Appl. No.: 09/433,642

(22) Filed: Nov. 3, 1999

Related U.S. Application Data

(62) Division of application No. 09/069,035, filed on Apr. 27, 1998.

(51) Int. Cl.[7] ................................................. H03K 19/177
(52) U.S. Cl. ............................... 326/38; 326/93; 326/101
(58) Field of Search .................................. 326/37–41, 93, 326/101

(56) References Cited

U.S. PATENT DOCUMENTS

| | | | | |
|---|---|---|---|---|
| 4,903,223 | * | 2/1990 | Norman et al. | 364/716 |
| 4,912,342 | * | 3/1990 | Wong et al. | 307/465 |
| 5,140,184 | * | 8/1992 | Hamamoto et al. | 307/303 |
| 5,396,129 | * | 3/1995 | Tabira | 326/93 |
| 5,668,484 | * | 9/1997 | Nomura | 326/93 |

* cited by examiner

*Primary Examiner*—Michael Tokar
*Assistant Examiner*—Don Phu Le
(74) *Attorney, Agent, or Firm*—Skjerven Morrill MacPherson

(57) ABSTRACT

A programmable logic device includes a global clock structure and a plurality of localized clock structures. Each localized clock structure distributes a respective localized clock signal to a corresponding portion of the programmable logic device. The global clock structure distributes a global clock signal to all portion of the programmable logic device.

2 Claims, 3 Drawing Sheets

COMBINATION OF GLOBAL CLOCK AND LOCALIZED CLOCKS

CROSS-REFERENCE TO RELATED APPLICATION

This is a divisional of U.S. application Ser. No. 09/069,035, filed Apr. 27, 1998, entitled "Combination Of Global Clock And Localized Clocks," by Albert Chan; Ju Shen; Cyrus Y. Tsui; Allan T. Davidson.

TECHNICAL FIELD OF THE INVENTION

The present invention relates generally to semiconductor integrated circuits, and more particularly, to a combination of a global clock and localized clocks.

BACKGROUND OF THE INVENTION

A programmable logic device (PLD) is a standard product which can be purchased by systems manufacturers in a "blank" state and, thereafter, custom-configured into a virtually unlimited number of specific logic functions by programming the device. Because programmable logic devices provide great flexibility, these devices can be incorporated into a variety of systems.

The performance at which any such system can be operated is a function, at least in part, of the set-up time ($T_{SU}$) and clock-to-output delay time ($T_{CO}$) of the clock signals supplied to programmable logic device. The set-up time is the amount of time that information or data must be present at an input terminal before it can be latched and stored in the input registers of the programmable logic device. The clock-to-output delay time is the time that it takes for data to be present at an output terminal after a clock occurs. The operating frequency for the device is limited by the reciprocal of the sum of the set-up time and the clock-to-output delay time. This relationship is set out in the following equation:

$$f_{OP} \leq 1/(T_{SU}+T_{CO})$$

where, $f_{OP}$ is the operating frequency. Consequently, in order to maximize the operating frequency for the system, and hence, its performance, both the set-up time and the clock-to-output delay time should be minimized.

With previously developed techniques, however, the set-up time for a programmable logic device can not be decreased without producing a corresponding increase in the clock-to-output delay time. This is due to the fact that in a previously developed programmable logic device, a single global clock is used to drive both input and output signals at all locations of the device. A clock distribution structure comprising various lines, buffers, and other circuitry distributes the global clock so that it can be presented substantially simultaneously to all parts of the logic device. With this distribution, a delay in the global clock is created. This delay affects both the set-up time and the clock-to-output delay time. In particular, the set-up time can be decreased if the delay is longer. However, a longer delay in the global clock causes the clock-to-output delay time to be increased. Accordingly, any improvement in performance that would otherwise be provided by a decrease in set-up time is offset by a corresponding increase in clock-to-output delay time.

SUMMARY

The disadvantages and problems associated with previously developed programmable logic devices have been substantially reduced or eliminated using the present invention.

In accordance with an embodiment of the present invention, a programmable logic device includes a global clock structure and a plurality of localized clock structures. The global clock structure distributes a global clock signal throughout the programmable logic device. Each localized clock structure distributes a respective localized clock signal to a corresponding portion of the programmable logic device.

Important technical advantages of the present invention include providing both a global clock and a number of localized clocks on a programmable logic device. Each of the localized clocks is distributed and available only to a respective portion of the programmable logic device. The global clock is distributed throughout the device and available to all portions. The localized clocks and the global clock may each experience some delay, but the delay for the localized clocks will be less due to the smaller areas of distribution. Preferably, the global clock is used to drive input registers for the programmable logic device, while the localized clocks are used to drive output registers in the respective portions. Thus, the input data set-up time for the programmable logic device is determined by the global clock, whereas the clock-to-output delay time is determined by the localized clocks. Specifically, the set-up time is the time that data must be applied to the device input before the active edge of the global clock is applied to the global clock input. The clock-to-output delay time is the time it takes for data to appear at the device output after the local clock is applied to the local clock input. The set-up time can be decreased due to the longer delay of the global clock. Furthermore, due to the shorter delay and independence of the localized clocks, the clock-to-output delay time can be decreased as well. Accordingly, a system incorporating the programmable logic device may be operated at a higher frequency, thereby enhancing performance.

Other important technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

Figure 1:
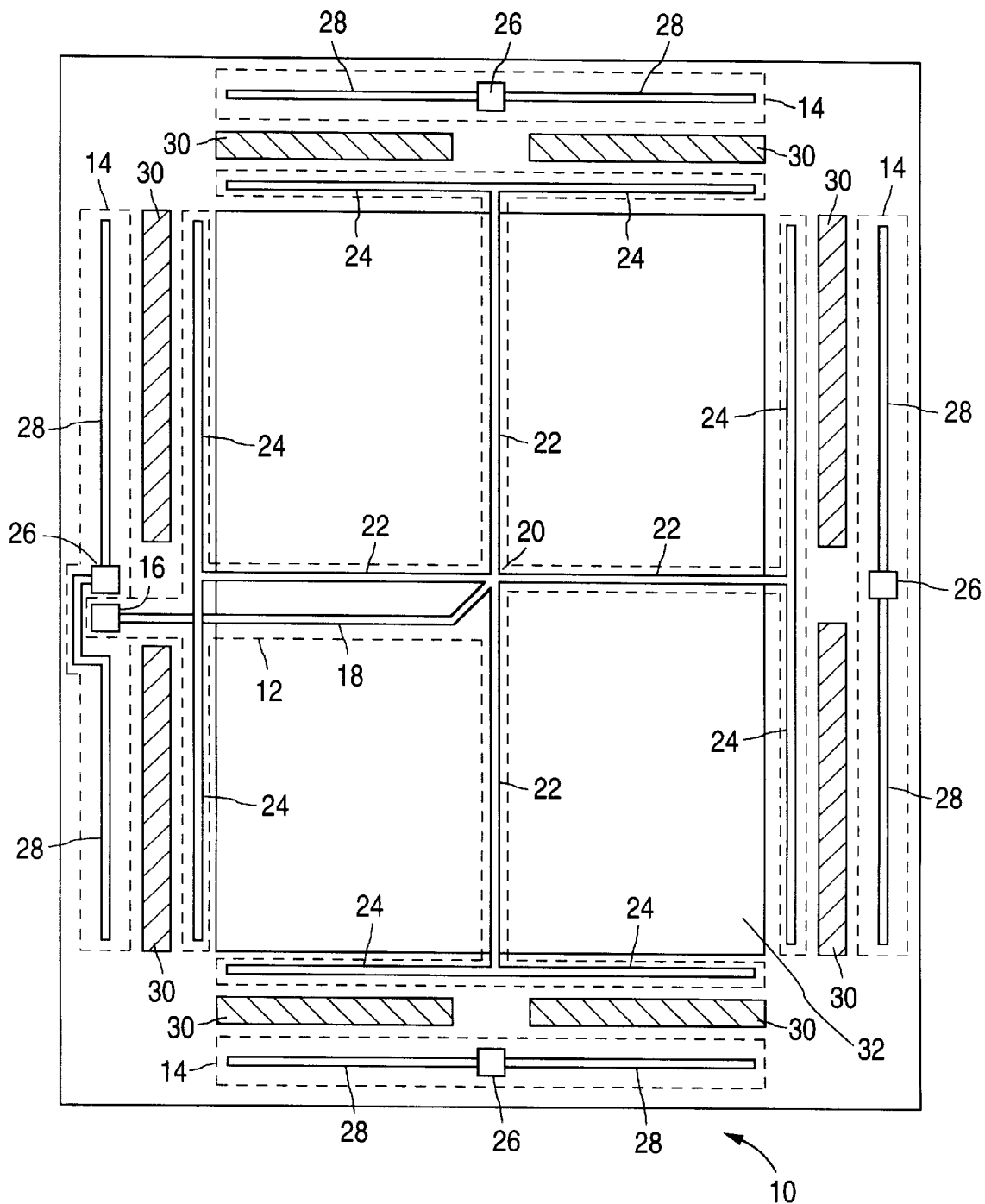
FIG. 1 illustrates a layout for a programmable logic device which utilizes a combination of a global clock and multiple localized clocks, in accordance with an embodiment of the present invention.
Figure 2:
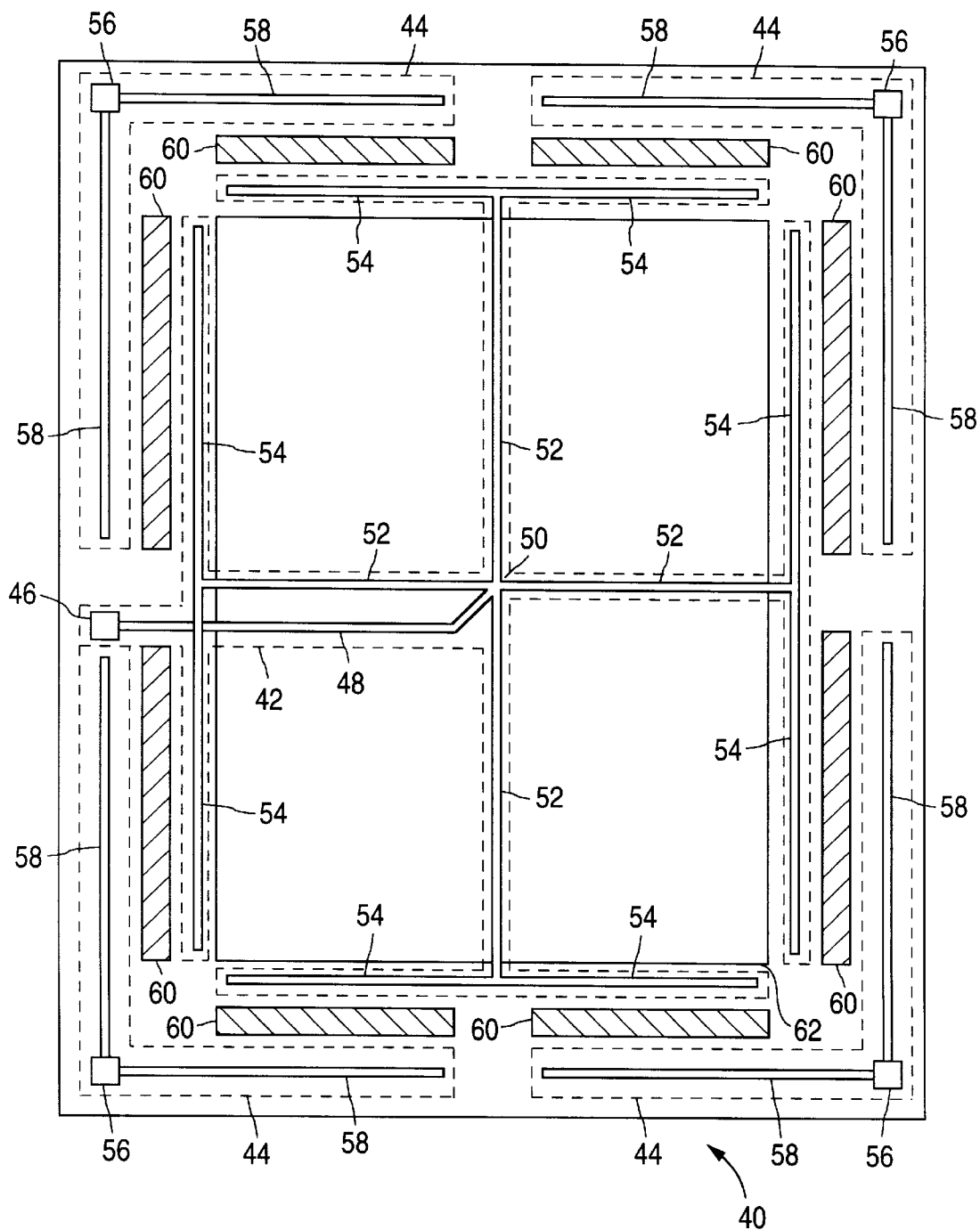
FIG. 2 illustrates a layout for a programmable logic device which utilizes a combination of a global clock and multiple localized clocks, in accordance with another embodiment of the present invention.
Figure 3:
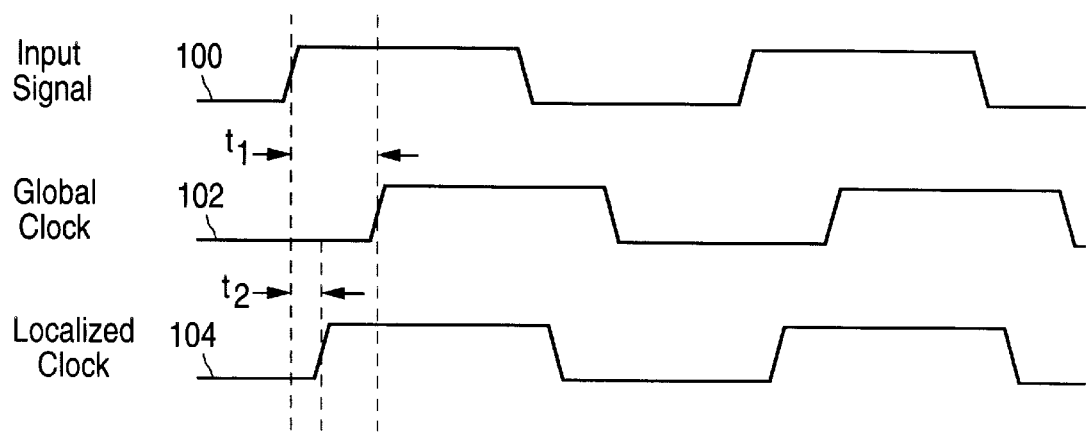
FIG. 3 is a timing diagram for various signals in a programmable logic device which utilizes a global clock and one or more localized clocks, in accordance with the present invention.

The preferred embodiments of the present invention and their advantages are best understood by referring to FIGS. 1 through 3 of the drawings. Like numerals are used for like and corresponding parts of the various drawings.

FIG. 1 illustrates a layout for a programmable logic device 10 which utilizes a combination of a global clock and multiple localized clocks, in accordance with an embodiment of the present invention. As explained below in more detail, each localized clock is available to drive only elements which are located in a respective portion of programmable logic device 10, whereas the global clock is available to drive elements in all portions of the device. To support the global clock and the multiple localized clocks, programmable logic device 10 comprises a global clock structure 12 and a plurality of localized clock structures 14.

Global clock structure 12 generally functions to distribute and uniformly present a global clock signal throughout programmable logic device 10. As shown, global clock structure 12 includes a pin 16, located in the middle of one edge or side of device 10, at which an input clock signal can be received. A line 18 is connected to pin 16. As used herein, the terms "connected," "coupled," or any variant thereof, means any connection or coupling, either direct or indirect, between two or more elements. Line 18 carries the input clock signal to a central point 20 in programmable logic device 10. From central point 20, the input clock signal is carried by lines 22 to the periphery or various sides of programmable logic device 10. Lines 22 and 24 make the clock signal available throughout the whole device.

Even though one particular implementation for a global clock structure on a programmable logic device has been shown and described, it should be understood that any other suitable implementation can be used. For example, another implementation may comprise a pin and one or more conductive lines which follow the edges of a logic device. Furthermore, it should be understood that more than one global clock may be provided on a programmable logic device.

Referring again to FIG. 1, although not shown for the sake of clarity, various circuitry comprising buffers, drivers, and the like, are connected to global clock structure 12. This circuitry buffers the input clock signal along lines 18, 22, and 24 so that the input clock signal can be distributed and then presented simultaneously throughout all portions of programmable logic device 10 as the global clock signal. Due to this buffering and distribution, an input signal experiences some delay before it is presented as the global clock signal.

Each localized clock structure 14 functions to distribute a respective localized clock signal in a corresponding portion of programmable logic device 10. In this embodiment, each localized clock structure 14 is located in and supports a separate side of logic device 10. Localized clock structures 14 each comprise a separate pin 26 located approximately in the middle of the respective side. Each of these pins 26 may receive a respective input clock signal, or alternatively, at least two of pins 26 may be connected together externally on a board to receive the same input clock signal. The respective input clock signals can be the same or separate for the various localized clock structures 14. Lines 28 extend in opposite directions from each pin 26 along the respective sides. These lines 28 make each of the various input clock signals available on the respective side as a respective localized clock signal. Each respective input clock signal experiences some delay before it is presented as a respective localized clock signal. Due to the smaller area of distribution, however, this delay in the localized clock signals is not as great as the delay for the global clock signal.

A plurality of input/output (I/O) cells 30 are located at the periphery or sides of programmable logic device 10. I/O cells 30 function to store or hold information input into or output from logic device 10. In particular, each I/O cell 30 comprises one or more registers connected to corresponding pins (not shown for the sake of clarity). The pins and registers can be programmed by an end user to support either input or output. Each I/O cell 30 may be driven by the global clock, supported by global clock structure 12, and one of the localized clocks, supported by the localized clock structure 14 on the respective side. Although not explicitly shown, appropriate connections are provided between each I/O cell 30 and the clock structures which drive it.

A logic section 32 is centrally located on programmable logic device 10. That is, logic section 32 is situated within the periphery defined by I/O cells 30. Although not explicitly shown, logic section 32 is connected to each I/O cell 30. In general, logic section 32 may perform any one or a combination of various operations upon bits of information received, stored, and/or generated within programmable logic device 10. At least a portion of this information can be input or output from logic device 10 at the registers and pins of I/O cells 30.

In operation, a respective input clock signal is applied to each of global clock structure 12 and localized clock structures 14. The input clock signal received by global clock structure 12 is buffered, distributed, and then presented simultaneously throughout programmable logic device 10 as the global clock signal. The global clock is preferably used to drive the input registers to receive the input of data at all I/O cells 30 of the logic device. The respective input clock signal for each localized clock structure 14 is distributed and presented in the corresponding portion of programmable logic device 10 as a respective localized clock signal. Each of the localized clocks is preferably used to drive the output registers to send output data at any I/O cells 30 located in the corresponding portion.

The localized clocks and the global clock may each experience some delay. In particular, with regard to the global clock, an input clock signal applied at pin 16 of global clock structure 12 is delayed because it must be carried or distributed across lines 18, 22, and 24. With regard to the localized clocks, an input clock signal applied at pin 26 of a particular localized clock structure 14 is delayed as the signal is distributed along respective lines 28. The delay for each of the localized clocks, however, can be less than that for the global clock because the distribution along lines 28 for each localized clock is shorter than the distribution along lines 18, 22, and 24 for the global clock.

The set-up time for programmable logic device 10 is determined by the global clock, whereas the clock-to-output delay time is determined by the localized clocks. The set-up time can be decreased due to the longer delay of the global clock. Furthermore, due to the shorter delay and independence of the localized clocks, the clock-to-output delay time can be decreased as well. Accordingly, a system incorporating programmable logic device 10 may be operated at a higher frequency, thereby enhancing performance.

In an alternative operation for programmable logic device 10, the global clock can also be used instead of, or in addition to, the localized clocks to drive at least some of the output registers to send output data at any I/O cells 30.

FIG. 2 illustrates a layout for a programmable logic device 40 which utilizes a combination of a global clock and multiple localized clocks, in accordance with another embodiment of the present invention. Programmable logic device 40 includes a global clock structure 42 and a plurality of localized clock structures 44 for supporting the global clock and the multiple localized clocks, respectively. Global clock structure comprises pin 46, line 48, central point 50, lines 52, and lines 54. Each localized clock structure 44 comprises a pin 56 with lines 58 extending therefrom. Programmable logic device 40 also includes a number of I/O cells 60 and a logic section 62. These elements of programmable logic device 40 are substantially similar to the elements referred to by like names in the description for programmable logic device 10 of FIG. 1. Significant differences between the elements of programmable logic device 40 and programmable logic device 10 are as follows.

In programmable logic device 40, pins 56 of the respective localized clock structures 44 are located at the corners of the device. Lines 58 extend from each pin 56 along the respective sides which define each corner. Due to this arrangement, each localized clock structure 44 supports I/O cells 60 located in the respective corners.

Programmable logic device 40 operates in a manner similar to programmable logic device 10 shown in FIG. 1, and thus, provides substantially the same advantages. In particular, input clock signals are applied to each of global clock structure 42 and localized clock structures 44 to produce a global clock and a plurality of localized clocks, respectively. The global clock is preferably used to drive the input registers to receive data at all I/O cells 60. Each of the localized clocks is preferably used to drive the output registers to send output data at any I/O cells 60 located in the corresponding corners. The global clock and the localized clocks may experience some delay, but the delay for the localized clocks is not as great as that for the global clock. The set-up time for programmable logic device 40 can be decreased due to the larger delay of the global clock. Furthermore, due to the shorter delay and independence of the localized clocks, the clock-to-output delay time can be decreased as well. Accordingly, a system incorporating programmable logic device 40 may be operated at a high frequency, thereby enhancing performance.

FIG. 3 is a timing diagram for various signals in a programmable logic device which utilizes a global clock and one or more localized clocks, in accordance with the present invention. In FIG. 3, an input clock signal 100 has the form of a clock signal with a repeating high and low pattern.

A global clock signal 102 may be generated from input clock signal 100. In particular, as described above, the input clock signal may be distributed via a global clock structure and presented as the global clock signal to all portions of the programmable logic device. Due to this distribution, a time delay $t_1$ is created between input clock signal 100 and global clock signal 102.

By way of comparison, a localized clock signal 104 may also be generated from input clock signal 100. Specifically, the input clock signal can be distributed via a localized clock structure and presented in a respective portion of the programmable logic device as the localized clock signal. Due to the distribution in the localized clock structure, a time delay $t_2$ is created between input clock signal 100 and localized clock signal 104.

Time delay $t_2$ associated with localized clock signal 104 is less than time delay $t_1$ associated with the global clock signal 102. This difference in delay times is due to the fact that the localized clock structure distributes in a smaller area than the global clock structure.

In light of the above difference in time delay, it is advantageous to use global clock signal 102 to drive the input of information at I/O cells in the programmable logic device. The longer delay $t_1$ allows the data to arrive at a later time at the input pins of the device relative to the time at which the global input clock signal arrives at its respective pin. This constitutes a smaller set-up time for the data relative to the clock.

Furthermore, it is advantageous to use the localized clock signal 104 to drive the output from the I/O cells of the programmable logic device. In particular, because time delay $t_2$ is smaller, the output from programmable logic device can be sent out more rapidly than would be the case if the global clock signal 102 was used to perform this function.

Although the present invention and its advantages have been described in detail, it should be understood that various changes, substitutions, and alterations can be made therein without departing from the spirit and scope of the invention as defined by the appended claims.

What is claimed is:

1. A programmable logic device, comprising:

a plurality of state elements, each having a clock input terminal provided in first and second regions of said programmable logic device, said first and second regions being non-overlapping;

a first conductor provided in said programmable logic device within said first region but not in said second region;

a second conductor provided in said programmable logic device within said second region, but not in said first region;

a first input terminal, coupled to said first conductor, for receiving a first input signal from outside of said programmable logic device;

a second input terminal, coupled to said second conductor, for receiving a second input signal from outside of said programmable logic device; and a programmable circuit for selectably coupling said first input signal from said first conductor to said clock input terminals of said state elements provided in said first region and said second input signal from said second conductor to said clock input terminals of said state elements provided in said second region.

2. A programmable logic device as in claim 1, further comprising:

a third conductor provided in said programmable logic device within both said first and second regions; and a third input terminal, coupled to said third conductor, for receiving a third input signal from outside of said programmable logic device;

wherein said programmable logic device further selectably couples, within said first and second regions, said third input signal to said clock input terminal of said state elements in said first and second regions.

* * * * *